United States Patent
Murayama et al.

(10) Patent No.: US 7,675,451 B2
(45) Date of Patent: Mar. 9, 2010

(54) SERIAL-PARALLEL TYPE ANALOG-TO-DIGITAL CONVERTER AND ANALOG-TO-DIGITAL CONVERSION METHOD

(75) Inventors: Shigemitsu Murayama, Nagasaki (JP); Yasuhide Shimizu, Nagasaki (JP); Kohei Kudo, Nagasaki (JP); Hiroaki Yatsuda, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/232,636

(22) Filed: Sep. 22, 2008

(65) Prior Publication Data

US 2009/0102693 A1 Apr. 23, 2009

(30) Foreign Application Priority Data

Oct. 22, 2007 (JP) .............................. 2007-274445

(51) Int. Cl.
H03M 1/36 (2006.01)
(52) U.S. Cl. ...................... 341/159; 341/120; 341/155; 341/156; 341/160; 341/161
(58) Field of Classification Search ................. 341/118, 341/120, 155, 156, 159, 160, 161
See application file for complete search history.

(56) References Cited

U.S. PATENT DOCUMENTS

| 4,214,232 | A | * | 7/1980 | Shaw et al. | 341/156 |
| 5,072,220 | A | * | 12/1991 | Petschacher et al. | 341/156 |
| 5,151,700 | A | * | 9/1992 | Matsuzawa et al. | 341/156 |
| 5,726,653 | A | * | 3/1998 | Hsu et al. | 341/156 |
| 5,861,829 | A | * | 1/1999 | Sutardja | 341/122 |
| 5,936,566 | A | * | 8/1999 | Park | 341/159 |
| 6,218,975 | B1 | * | 4/2001 | Tsukamoto et al. | 341/159 |
| 6,411,233 | B1 | * | 6/2002 | Sutardja | 341/120 |
| 6,590,518 | B1 | * | 7/2003 | Taft | 341/156 |
| 6,606,048 | B1 | * | 8/2003 | Sutardja | 341/155 |
| 6,611,222 | B1 | * | 8/2003 | Murphy | 341/155 |
| 6,674,385 | B2 | * | 1/2004 | Micheloni et al. | 341/155 |
| 6,778,124 | B2 | * | 8/2004 | Hashimoto et al. | 341/155 |
| 7,221,303 | B1 | * | 5/2007 | Melanson | 341/143 |
| 7,420,499 | B2 | * | 9/2008 | Sakata et al. | 341/155 |
| 7,477,177 | B2 | * | 1/2009 | Kuramochi et al. | 341/156 |

FOREIGN PATENT DOCUMENTS

| JP | 62-071336 A | 4/1987 |
| JP | 01-191520 A | 8/1989 |
| JP | 06-112823 A | 4/1994 |
| JP | 2004-064475 | 2/2004 |

OTHER PUBLICATIONS

Japanese Office Action issued Aug. 25, 2009 for corresponding Japanese Application No. 2007-274445.

* cited by examiner

Primary Examiner—Linh V Nguyen
(74) Attorney, Agent, or Firm—Rader, Fishman & Grauer PLLC

(57) ABSTRACT

A serial-parallel type analog-to-digital converter includes a reference voltage generator, a higher bit comparing portion and a lower bit comparing portion, and a reference voltage selecting portion, wherein the lower bit comparing portion includes the plurality of comparison stages.

3 Claims, 9 Drawing Sheets

SERIAL-PARALLEL TYPE ANALOG-TO-DIGITAL CONVERTER AND ANALOG-TO-DIGITAL CONVERSION METHOD

CROSS REFERENCES TO RELATED APPLICATIONS

The present invention contains subject matter related to Japanese Patent Application JP 2007-274445 filed in the Japanese Patent Office on Oct. 22, 2007, the entire contents of which being incorporated herein by reference

BACKGROUND OF THE INVENTION

1. Field of the Invention

The present invention relates to a serial-parallel type analog-to-digital converter and a serial-parallel type analog-to-digital converting method.

2. Description of Related Art

An analog-to-digital converter for converting an analog signal into a digital signal has been widely used owing to the popularization of digital apparatuses. Also, an enhancement of a processing speed and reduction in power consumption are required for the analog-to-digital converter along with the miniaturization and promotion of inexpensiveness of the recent digital apparatuses. A serial-parallel type analog-to-digital converter for converting and separately dividing an analog signal into a higher bit side and a lower bit side of a digital signal attracts attention as an analog-to-digital converter which is capable of realizing the enhancement of the processing speed and the reduction in power consumption.

Here, FIG. 8 shows an example of the serial-parallel type analog-to-digital converter in the related art. As shown in FIG. 8, the serial-parallel type analog-to-digital converter 101 is composed of a reference voltage generator 102, a higher bit comparing portion 103, a lower bit comparing portion 104, a higher bit side encoder 105, a lower bit side encoder 106, a timing generator 107, and the like. In this case, the reference voltage generator 102 generates a plurality of different reference voltages for comparison, and the higher bit comparing portion 103 compares a voltage of an analog signal with each of corresponding ones, for a higher bit, of the reference voltages (hereinafter referred to as "higher bit reference voltages" when applicable). In addition, the lower bit comparing portion 104 compares the voltage of the analog signal with each of corresponding ones, for a lower bit, of the reference voltages (hereinafter referred to as "lower bit reference voltages" when applicable), and the higher-bit side encoder 105 logically processes output signals from the higher bit comparing portion 103 to output a digital signal on the higher bit side corresponding to the analog signal. In addition, the lower bit side encoder 106 logically processes output signals from the lower bit comparing portion 104 to output a digital signal on a lower bit side corresponding to the analog signal. Also, the timing generator 107 generates control signals in accordance with which the higher bit comparing portion 103 and the lower bit comparing portion 104, the higher bit side encoder 105 and the lower bit side encoder 106, and the like are controlled, respectively.

Here, the reference voltage generator 102 is configured so as to generate the higher bit reference voltages used in the higher bit comparing portion 103, and the lower bit reference voltages used in the lower bit comparing portion 104.

Also, the serial-parallel type analog-to-digital converter 101 is provided with a multiplexer (MUX) 108. In this case, the multiplexer 108 selects the lower bit reference voltages which are used in the lower bit comparing portion 104 in accordance with the result of comparing the voltage of the analog signal with each of the higher bit reference voltages in the higher bit comparing portion 103. Also, the multiplexer 108 is connected in an output portion thereof to the lower bit comparing portion 104.

The lower bit comparing portion 104 is composed of a comparison stage 110, an amplification stage 111, and a comparison/hold section 112. In this case, the comparison stage 110 outputs a difference voltage between the voltage of the analog signal, and the corresponding one of the lower bit reference voltages. The amplification stage 111 amplifies an output signal from the comparison stage 110. Also, the comparison/hold section 112 compares an output signal from the amplification stage 111 with a predetermined threshold, and holds therein the comparison result in the form of data of "0" or "1". It is noted that the comparison stage 110, the amplification stage 111, and the comparison/hold section 112 are provided by a number corresponding to the number of lower bits to be converted (for example, by 7 when the number of lower bits is 3 bits, and by 15 when the number of lower bits is 4 bits).

As shown in FIGS. 9A and 9B, the comparison stage 110 of the lower bit comparing portion 104 includes a switch SW100, a switch SW102, and a capacitor C100. The corresponding one of the lower bit reference voltages which are each outputted from the multiplexer 108 to a reference voltage input terminal 120 is inputted to one terminal of the capacitor C100. Also, the analog signal is inputted to the other terminal (input portion) of the switch SW100.

Also, when each of the switches SW100 and SW102 is held ion an ON state, and no lower bit reference voltage is inputted from the multiplexer 108 to the one terminal of the capacitor C100, the comparison stage 110 is held in a mode of inputting (applying) the analog signal to the one terminal of the capacitor C100 to sample the analog signal (hereinafter referred to as "a reset mode" when applicable) (refer to FIG. 9A). On the other hand, when each of the switches SW100 and SW102 is held ion an OFF state, and the corresponding one of the lower bit reference voltages is each inputted from the multiplexer 108 to the one terminal of the capacitor C100, the comparison stage 110 is held in a mode of outputting the difference voltage between the voltage of the analog signal and the corresponding one of the lower bit reference voltages from the capacitor C100 to the amplification stage 111 the subsequent stage (hereinafter referred to as "a comparison mode" when applicable) (refer to FIG. 9B).

However, short-circuit is caused between the output portion of the switch SW100 in the comparison stage 110, and the output portion of the multiplexer 108. Thus, there is provided a state in which a parasitic capacitance due to the switch of the multiplexer 108, and a parasitic capacitance parasitic in a wiring extending from the multiplexer 108 to the comparison stage 110 are equivalently connected to the output portion of the switch SW100. As a result, when the comparison stage 110 is held in the reset mode, a load applied to the analog signal (in other words, a load applied to a circuit for outputting the analog signal to the comparison stage 110) increases by these parasitic capacitances (they are each designated with reference symbol Cp of FIGS. 9A and 9B). Along with this increase in load, the processing speed when the analog signal is converted into the digital signal on the lower bit side is reduced.

As described above, in the serial-parallel type analog-to-digital converter 101 in the related art, the short circuit is caused between the output portion of the switch SW100, and the output portion of the multiplexer 108. As a result, the load applied to the analog signal increases, and thus it is difficult to further speed up the operation of the serial-parallel type analog-to-digital converter.

In order to cope with this situation, the applicant of this patent application proposed a serial-parallel type analog-to-digital converter as shown in FIG. 10. That is to say, the serial-parallel type analog-to-digital converter includes a switch SW103 provided between an output portion of a switch SW100 and an output portion of a multiplexer 108, a switch SW104, and an amplifier AMP101. In this case, the switch SW103 is an opening/closing section for performing open/close between the output portion of the switch SW100, and the output portion of the multiplexer 108. The switch SW104 is an input section for inputting therethrough a voltage of an analog signal to the output portion of the multiplexer 108 in a phase of the open state caused between the output portion of the switch SW100, and the output portion of the multiplexer 108 by the switch SW103. Also, the amplifier AMP101 is an amplification section for amplifying the analog signal. This serial-parallel type analog-to-digital converter, for example, is described in Japanese Patent Laid-Open No. 2004-64475.

In this serial-parallel type analog-to-digital converter, the open state can be caused between the output portion of the switch SW100 in the comparison stage 110, and the output portion of the multiplexer 108 by the switch SW103 in the phase of the reset mode in the comparison stage 110. Moreover, it is possible to previously precharge the parasitic capacitances Cp equivalently connected to the output portion of the multiplexer 108 by the switch SW104 and the amplifier AMP101. As a result, the load applied to the analog signal can be lightened by the parasitic capacitance Cp parasitic in the output portion of the switch SW100 in the phase of the reset mode in the comparison stage 110. Moreover, the load applied to the reference voltages in the phase of the comparison mode (in other words, the load applied to the multiplexer 8) can be lightened. As a result, it is possible to speed up the operation of the serial-parallel type analog-to-digital converter.

Now, the comparison stage 110 of the lower bit comparison portion 104 must hold therein the sampled voltage for a time period from a time point when the voltage of the analog signal is sampled in the capacitor C100 to a time point when the higher bit comparing portion 103 outputs a signal based on the comparison result.

Now, a serial-parallel type analog-to-digital converter is known in which in order to effectively utilize such a waiting time period, a plurality of comparison stages are prepared for the lower bit comparing portion 104, and an interleave operation for alternately operating the plurality of comparison stages is performed, thereby enhancing the conversion efficiency.

In the case as well of the serial-parallel type analog-to-digital converter performing such an interleave operation, the provision of the opening/closing section, input section and amplification section described above makes it possible to lighten the load applied to the analog signal or the reference voltages, thereby speeding up the operation of the serial-parallel type analog-to-digital converter.

SUMMARY OF THE INVENTION

However, in the serial-parallel type analog-to-digital converter performing the interleave operation in the manner as described above, in addition to the circuit for the interleave operation, the input section and amplification section described above are required therefor, which results in that a chip area increases.

In the light of the foregoing, it is therefore desirable to provide a serial-parallel type analog-to-digital converter which is capable of realizing a high-speed operation without providing an input section for inputting therethrough an analog signal to a reference selecting portion, and an amplification section.

In order to attain the desire described above, according to an embodiment of the present invention, there is provided a serial-parallel type analog-to-digital converter including a reference voltage generator for generating a plurality of different reference voltages, and a higher bit comparing portion and a lower bit comparing portion each having a comparison stage for alternately performing a reset mode of sampling a voltage of an analog signal, and a comparison mode of comparing the voltage of the analog signal with the corresponding one of the plurality of different reference voltages. The serial-parallel type analog-to-digital converter further includes a reference voltage selecting portion for selecting the reference voltages corresponding to a comparison result obtained from the higher bit comparing portion from the plurality of different reference voltages generated in the reference voltage generator, and outputting the reference voltages thus selected to the lower bit comparing portion. The serial-parallel type analog-to-digital converter serves to convert the analog signal into a digital signal in accordance with the comparison results obtained from the higher bit comparing portion and the lower bit comparing portion. The lower bit comparing portion includes the plurality of comparison stages each performing an interleave operation, which operates one of the plurality of comparison stages in the reset mode in a phase of the reset mode of the higher bit comparing portion, and operates one of the plurality of comparison stages in the comparison mode in a phase of the comparison mode of the higher bit comparing portion. When one of the plurality of comparison stages of the lower bit comparing portion is in the reset mode, the corresponding ones of the reference voltages are inputted from the reference voltage selecting portion to other comparison stages of the plurality of comparison stages.

As has been just described, when one of the comparison stages of the lower bit comparing portion is in the reset mode, the corresponding ones of the reference voltages are inputted from the reference voltage selecting portion to other comparison stages of the plurality of comparison stages. As a result, it is possible to previously perform the precharge between other comparison stages of the plurality of comparison stages, and the reference voltage selecting portion before the operation mode proceeds to the comparison mode.

In addition, according to another embodiment of the present invention, there is provided a serial-parallel type analog-to-digital converting method for use in a serial-parallel type analog-to-digital converter including a reference voltage generator for generating a plurality of different reference voltages, a higher bit comparing portion and a lower bit comparing portion each having a comparison stage for alternately performing a reset mode of sampling a voltage of an analog signal, and a comparison mode of comparing the voltage of the analog signal with the corresponding one of the plurality of different reference voltages. The serial-parallel type analog-to-digital converting method further includes a reference voltage selecting portion for selecting the reference voltages corresponding to a comparison result obtained from the higher bit comparing portion from the plurality of different reference voltages generated in the reference voltage generator, and outputting the reference voltages thus selected to the lower bit comparing portion. The serial-parallel type analog-to-digital converter serves to convert the analog signal into a digital signal in accordance with the comparison results obtained from the higher bit comparing portion and the lower bit comparing portion. The lower bit comparing portion includes a plurality of comparison stages each performing an interleave operation, the serial-parallel type analog-to-digital converting method including the first step of operating one of the plurality of comparison stages provided in the lower bit comparing portion in the reset mode in a phase of the reset mode of the higher bit comparing portion. The serial-parallel type analog-to-digital converting method further includes the second step of operating one of the plurality of comparison stages provided in the lower bit comparing portion in the comparison mode in a phase of the comparison mode of the higher bit comparing portion, and inputting the corresponding ones of the reference voltages from the reference voltage selecting portion to other comparison stages of the plurality of comparison stages provided in the lower bit comparing portion when the one comparison stage is in the reset mode in the first step.

As has been just described, when one of the comparison stages of the lower bit comparing portion is in the reset mode, the corresponding ones of the reference voltages are inputted from the reference voltage selecting portion to other comparison stages of the plurality of comparison stages. As a result, it is possible to previously perform the precharge between other comparison stages of the plurality of comparison stages, and the reference voltage selecting portion before the operation mode proceeds to the comparison mode.

According to the present invention, it is possible to provide the serial-parallel type analog-to-digital converter which is capable of realizing a high-operation speed.

DETAILED DESCRIPTION OF THE PREFERRED EMBODIMENTS

Figure 1:
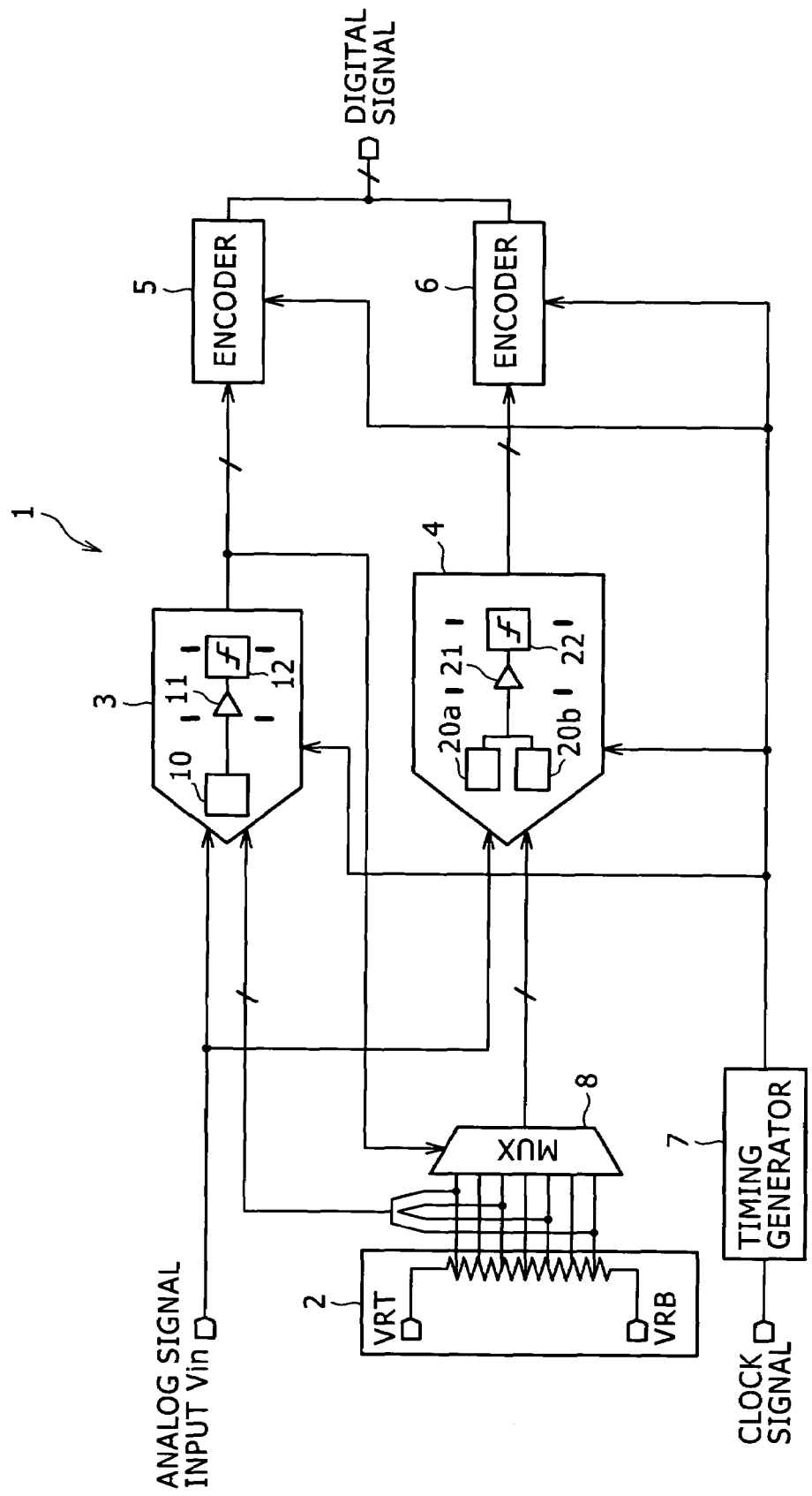
FIG. 1 is a block diagram, partly in circuit, showing a schematic configuration of a serial-parallel type analog-to-digital converter according to an embodiment of the present invention.

A serial-parallel type analog-to-digital converter according to an embodiment mode of the present invention includes a reference voltage generator for generating a plurality of different reference voltages, a higher bit comparing portion and a lower bit comparing portion each having a comparison stage for alternately performing a reset mode of sampling a voltage of an analog signal, and a comparison mode of comparing the voltage of the analog signal with the corresponding one of the plurality of different reference voltages, and a reference voltage selecting portion for selecting the reference voltages corresponding to a comparison result obtained from the higher bit comparing portion from the plurality of different reference voltages generated in the reference voltage generator, and outputting the reference voltages thus selected to the lower bit comparing portion, the serial-parallel type analog-to-digital converter serving to convert the analog signal into a digital signal in accordance with the comparison results obtained from the higher bit comparing portion and the lower bit comparing portion.

Also, the lower bit comparing portion includes a plurality of comparison stages, each performing an interleave operation, so as to correspond to the reference voltages used for comparison, respectively. In a phase of the reset mode of the higher bit comparing portion, the lower bit comparing portion operates one of the plurality of comparison stages in the reset mode. Also, in a phase of the comparison mode of the higher bit comparing portion, the lower bit comparing portion operates one of the plurality of comparison stages concerned in the comparison mode. It is noted that when for example, the number of lower bits to be converted is 3 bits, the number of reference voltages to be compared is 7. At this time, the number of sets of comparison stages composed of a plurality of comparison stages each performing the interleave operation is 7. However, for example, the number of comparison stages can also be reduced by using an interpolation technique.

When the comparison stages of the lower bit comparing portion are two comparison stages of a first comparison stage and a second comparison stage, the first comparison stage compares the voltage of the analog signal with the corresponding one of the reference voltages with a first cycle, and the second comparison stage compares the voltage of the analog signal with the corresponding one of the reference voltages with a second cycle. Note that, in this case, an operation from the reset mode in the higher bit comparing portion to the comparison mode in the higher bit comparing portion is set as one cycle. Also, the first cycle and the second cycle alternate every one cycle.

That is to say, a reset mode for generation of X-th digital data (X: an arbitrary numeric number) is set as "an X-th reset mode" and a comparison mode for generation of X-th digital data is set as "an X-th comparison mode". In this case, (a) when the comparison stage of the higher bit comparing portion is set in an N-th reset mode, the first comparison stage of the lower bit comparing portion is set in the N-th reset mode. (b) When the comparison stage of the higher bit comparing portion is set in an N-th comparison mode, the second stage of the lower bit comparing portion is set in an (N−1)-th comparison mode. In addition, (c) when the comparison stage of the higher bit comparing portion is set in an (N+1)-th reset mode, the second comparison stage of the lower bit comparing portion is set in an (N+1)-th reset mode. Also, (d) when the comparison stage of the higher bit comparing portion is set in an (N+1)-th comparison mode, the first comparison stage of the lower bit comparing portion is set in an N-th comparison mode.

Also, when one of the first comparison stage and the second comparison stage is set in the reset mode, the corresponding one of the reference voltage is inputted from the reference voltage selecting portion to the other of the first comparison stage and the second comparison stage.

As a result, when one of the first comparison stage and the second comparison stage is set in the reset mode, the corresponding one of the reference voltages is applied across the other of the first comparison stage and the second comparison stage and the reference voltage selecting portion.

As a result, the precharge is performed between the comparison stage and the reference voltage selecting portion before the comparison stage concerned is set in the comparison mode (for comparison of the voltage of the analog signal with the corresponding one of the reference voltages). Thus, it is possible to reduce an influence exerted from the parasitic capacitance parasitic between the comparison stage and the reference voltage selecting portion on the speed-up of the operation of the serial-parallel type analog-to-digital converter.

Here, the lower bit comparing portion of this embodiment mode includes amplification stages for amplifying output signals from the comparison stages, respectively. In addition, each of the comparison stages of the lower bit comparing portion includes a first switch, a second switch, a capacitor (hereinafter referred to as "a comparison capacitor"), a third switch, and a fourth switch. In this case, the voltage of the analog signal is inputted through the first switch, and the corresponding one, of the reference voltages, outputted from the reference voltage selecting portion is inputted through the second switch. In addition, the capacitor (comparison capacitor) is connected in one terminal thereof to each of output portions of the first switch and the second switch. Also, the third switch is connected to the other terminal of the comparison capacitor, and the fourth switch is connected between the other terminal of the capacitor, and each of the amplification stages. In a phase of the reset mode, each of the first switch and the third switch is turned ON to input the voltage of the analog signal to the comparison capacitor, thereby sampling the voltage of the analog signal in the comparison capacitor. In a subsequent phase of the comparison mode, each of the second switch and the fourth switch is turned ON, thereby outputting a difference voltage between the voltage of the analog signal, and the corresponding one of the reference voltages from the comparison capacitor.

Also, when one of the comparison stages of the lower bit comparing portion is set in the reset mode, the second switch of the other of the comparison stages of the lower bit comparing portion is turned ON.

As a result, when one of the comparison stages of the lower bit comparing portion is set in the reset mode, the precharge is performed up to the other terminal side (the fourth switch side) of the comparison capacitor of the other of the comparison stages of the lower bit comparing portion by using the corresponding one of the reference voltages.

As a result, the precharge is performed up to the other terminal (the fourth switch side) of the comparison capacitor by using the corresponding one of the reference voltages before the operation mode of the other comparison stage proceeds to the comparison mode. Thus, an influence of the noises by the second switch is suppressed (the influence of the settling of the noises is relaxed) as compared with the case where the second switch is turned ON after the comparison mode is obtained. As a result, it is possible to speed up the operation of the serial-parallel type analog-to-digital converter.

Figure 2:
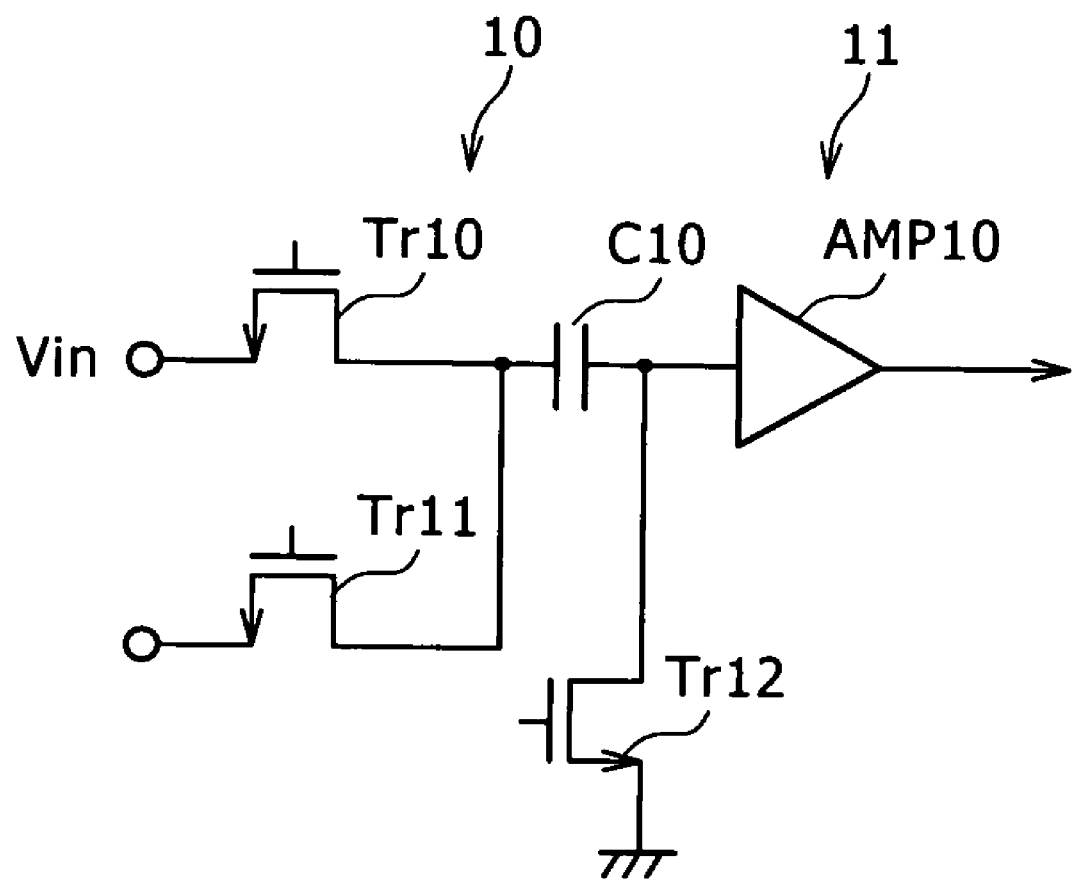
FIG. 2 is a circuit diagram explaining a comparison stage of a higher bit comparing portion shown in FIG. 1.
Figure 3:
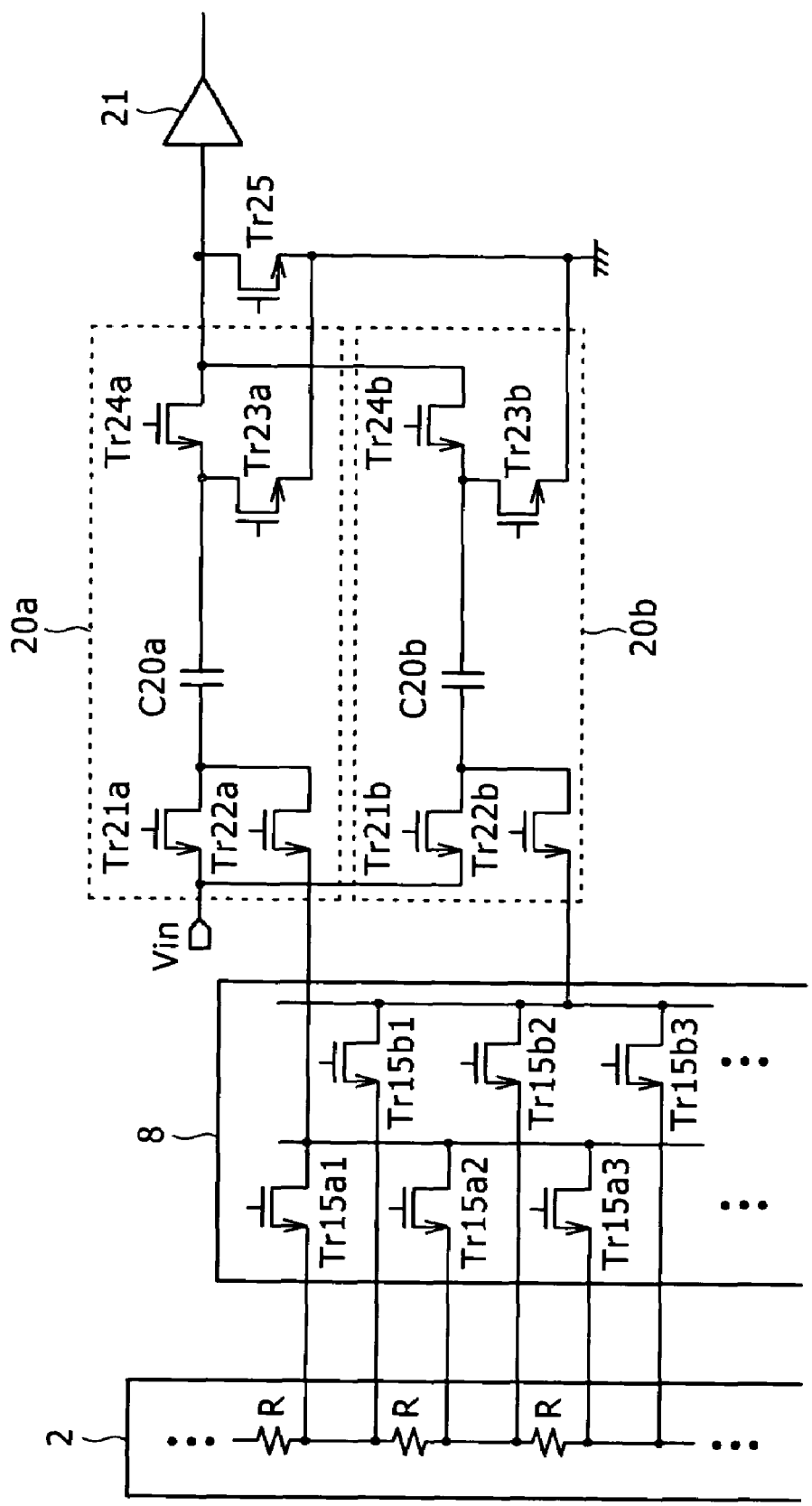
FIG. 3 is a circuit diagram explaining a comparison stage of a lower bit comparing portion shown in FIG. 1.
Figure 4:
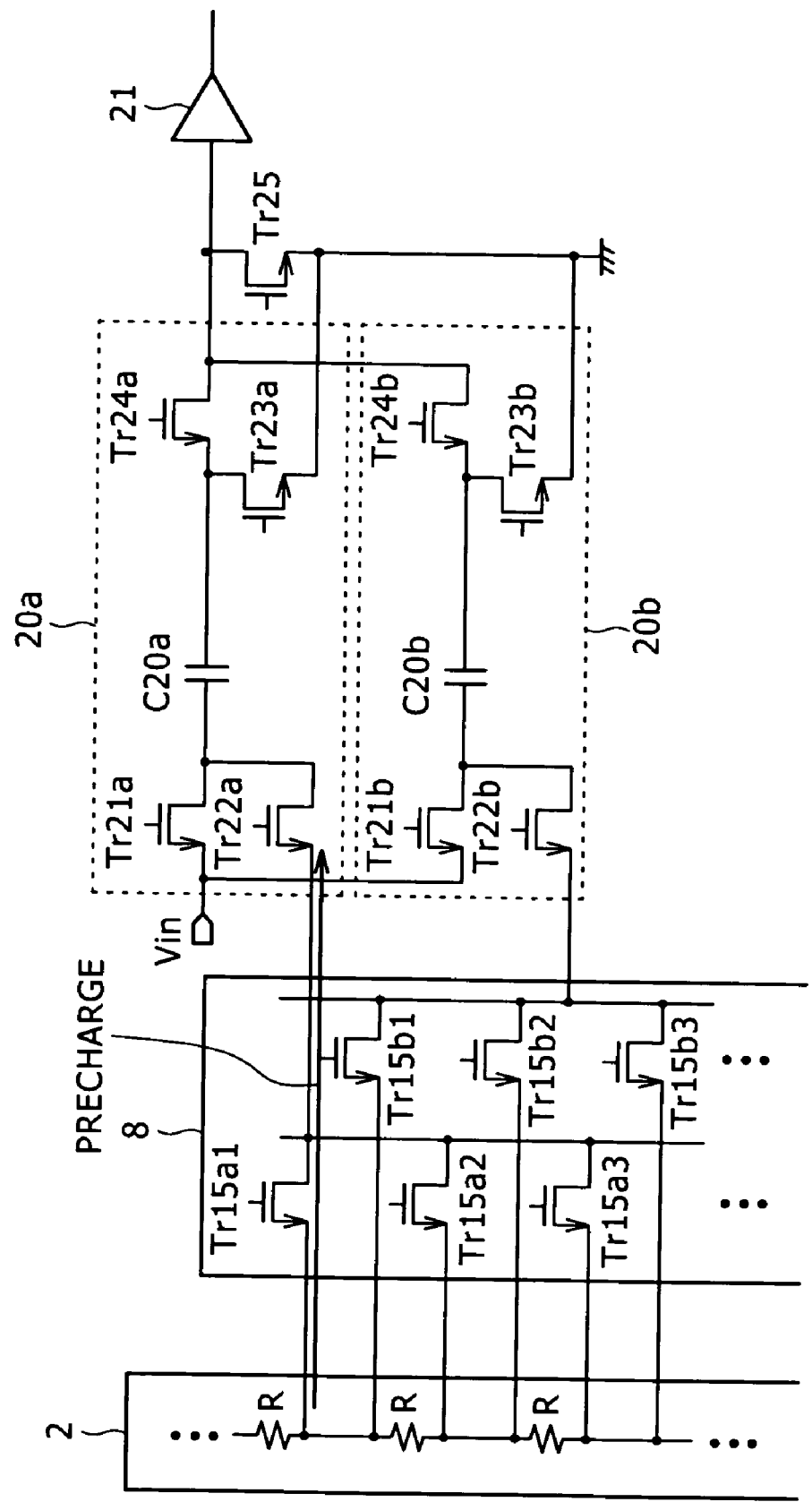
FIG. 4 is a circuit diagram explaining an operation of the comparison stage of the lower bit comparing portion shown in FIG. 1.

Hereinafter, a serial-parallel type analog-to-digital converter according to an embodiment of the present invention will be described in detail with reference to the accompanying drawings. FIG. 1 is a block diagram, partly in circuit, showing a schematic configuration of a serial-parallel type analog-to-digital converter according to an embodiment of the present invention, FIG. 2 is a circuit diagram explaining a comparison stage of a higher bit comparing portion shown in FIG. 1, FIG. 3 is a circuit diagram explaining a comparison stage of a lower bit comparing portion shown in FIG. 1, and FIG. 4 is a circuit diagram explaining an operation of the comparison stage of the lower bit comparing portion shown in FIG. 1.

As shown in FIG. 1, a serial-parallel type analog-to-digital converter of this embodiment is composed of a reference voltage generator 2, a higher bit comparing portion 3, a lower bit comparing portion 4, a higher bit side encoder 5, a lower bit side encoder 6, a timing generator 7, a multiplexer (MUX) 8, and the like. In this case, the reference voltage generator 2 generates a plurality of different reference voltages, and the higher bit comparing portion 3 compares a voltage of an analog signal Vin with each of higher bit reference voltages. In addition, the lower bit comparing portion 4 compares the voltage of the analog signal Vin with each of lower bit reference voltages, and the higher bit side encoder 5 logically processes an output signal from the higher bit comparing portion 3, and outputs a higher bit side digital signal corresponding to the analog signal Vin. Also, the lower bit side encoder 6 logically processes an output signal from the lower bit comparing portion 4, and outputs a lower bit side digital signal corresponding to the analog signal Vin, and the timing generator 7 generates control signals in accordance with which the higher bit comparing portion 3 and the lower bit comparing portion 4, and the higher bit encoder 5 and the lower bit side encoder 6, and the like are controlled, respectively. Also, the multiplexer 8 serves as a reference voltage selecting portion for selecting lower bit reference voltages which are intended to be inputted to the lower bit comparing portion 4. It is noted that the timing generator 7 operates in accordance with a clock signal inputted thereto.

Here, the reference voltage generator 2 is composed of a ladder resistor provided between a portion having a higher voltage (VRT) developed thereat and a portion having a lower voltage (VRB) developed thereat. Also, the reference voltage generator 2 generates the higher bit reference voltages used in the higher bit comparing portion 3, and the lower bit reference voltages used in the lower bit comparing portion 3. Also, the multiplexer 8 selects the lower bit reference voltages used in the lower bit comparing portion 3 in accordance with a result of comparing the voltage of the analog signal Vin with each of the higher bit reference voltages in the higher bit comparing portion 4. That is to say, the higher bit comparing portion 3 compares the voltage of the analog signal Vin with each of the higher bit reference voltages of a plurality of reference voltages generated by the reference voltage generator 2. The multiplexer 8 outputs a predetermined number of reference voltages, each being close to the voltage value of the analog signal Vin, of a plurality of reference voltages generated by the reference voltage generator 2 as the lower bit reference voltages to the lower bit comparing portion 4. It is noted that as will be described later, the multiplexer 8 is composed of a plurality of switches.

The higher bit comparing portion 3 is composed of a comparison stage 10, an amplification stage 11, and a comparison/hold section 12. In this case, the comparison stage 10 outputs a difference voltage between the voltage of the analog signal Vin and the corresponding one of the higher bit reference voltages, and the amplification stage 11 amplifies the output signal from the comparison stage 10. Also, the comparison/hold section 12 compares an output signal from the amplification stage 11 with a predetermined threshold, and holds therein the comparison result in the form of data of "0" or "1". It is noted that a unit of the comparison stage 10, the amplification stage 11, and the comparison/hold section 12 is provided every higher bit reference voltage. For example, when the number of higher bits to be converted is 3 bits, seven units of the comparison stages 10, the amplification stages 11, and the comparison/hold sections 12 are provided. However, for example, the number of comparison stages and amplification stages can also be reduced by using the interpolation technique.

The comparison stage 10, as shown in FIG. 2, is composed of MOS transistors Tr10, Tr11 and Tr12 each serving as a switch, and a capacitor C10. Control signals outputted from the timing generator 7 are inputted to gates of the MOS transistors Tr10, Tr11 and Tr12, respectively, so that ON/OFF states (close/open states) of the MOS transistors Tr10, Tr11 and Tr12 are controlled.

In addition, the voltage of the analog signal Vin is inputted to a source of the MOS transistor Tr10, and a drain of the MOS transistor Tr10 is connected to one terminal of the capacitor C10. The corresponding one of the higher bit reference voltages is inputted from the reference voltage generator 2 to a source of the MOS transistor Tr11, and a drain of the MOS transistor Tr11 is connected to the one terminal of the capacitor C10. An input terminal of the amplifier AMP10 as the amplification stage 11, and a drain of the MOS transistor TR12 are each connected to the other terminal of the capacitor C10. A source of the MOS transistor TR12 is connected to a reference potential (a grounding potential in this case).

Also, in the phase of the reset mode, the MOS transistors Tr10 and Tr12 are each turned ON (in the close state) in accordance with the corresponding ones of the control signals outputted from the timing generator 7 to apply the voltage of the analog signal Vin to the capacitor C10, thereby sampling the voltage of the analog signal Vin in the capacitor C10. That is to say, a difference voltage between the voltages at the opposite terminals of the capacitors C10 is made the voltage of the analog signal Vin.

Moreover, in the subsequent phase of the comparison mode, the MOS transistors Tr10 and Tr12 are each turned OFF (in the open state) and the MOS transistor Tr11 is turned ON (in the close state) in accordance with the corresponding ones of the control signals outputted from the timing generator 7, thereby outputting a difference voltage between the voltage of the analog signal Vin, and the corresponding one of the higher bit reference voltages to the amplification stage 11.

As has been just described, the comparison stage 10 of the higher bit comparing portion 3 samples and holds the voltage of the analog signal Vin in the capacitor C10 in the reset mode. Also, the comparison stage 10 of the higher bit comparing portion 3 applies the corresponding one of the higher bit reference voltages to the capacitor C10 in the subsequent comparison mode, thereby outputting a difference voltage between the voltage of the analog signal Vin and the corresponding one of the higher bit reference voltages.

Also, the output signal from the amplification stage 11 is binarized in the comparison/hold section 12, and a higher bit side digital signal is then outputted from the higher bit side encoder 5. In addition, the output signal from the comparison/hold section 12 is inputted to the multiplexer 8. After that, the multiplexer 8 selects the lower bit reference voltages in accordance with the output signal from the comparison/hold section 12, and outputs the lower bit reference voltages thus selected to the lower bit comparison portion 4. It is noted that a latched comparator or the like is used as the comparison/hold section 12.

The lower bit comparing portion 4, as shown in FIG. 1, is composed of a plurality of comparison stages 20a and 20b, an amplification stage 21, and a comparison/hold section 22. In this case, the plurality of comparison stages 20a and 20b output voltage differences between the voltage of the analog signal Vin, and the corresponding ones of the lower bit reference voltages, respectively. The amplification stage 21 amplifies the output signals (voltage differences) from the plurality of comparison stages 20a and 20b. Also, the comparison/hold section 22 compares an output signal from the amplification stage 21 with a predetermined threshold value, and holds therein the comparison result in the form of data of "0" or "1". It is noted that although a unit of the comparison stages 20a and 20b, the amplification stage 21, and the comparison/hold section 22 is provided by a number corresponding to the number of lower bits to be converted (for example, by 7 when the number of lower bits is 3), the numbers of comparison stages and amplification stages can also be reduced by, for example, using the interpolation technique. It is noted that the latched comparator or the like is used as the comparison/hold section 12.

Each of the comparison stages 20a and 20b is a comparison stage (comparison circuit) performing the interleave operation. Thus, each of the comparison stages 20a and 20b has a reset mode of sampling the voltage of the analog signal Vin, and a comparison mode of comparing the voltage of the analog signal Vin thus sampled with the corresponding one of the lower bit reference voltages. Also, each of the comparison stages 20a and 20b repeatedly executes the reset mode and the comparison mode in units of two cycles.

As shown in FIG. 3, the comparison stage 20a of the lower bit comparing portion 4 includes MOS transistors Tr21a to Tr24a, and a capacitor C20a. In this case, ON/OFF states (close/open states) of the MOS transistors Tr21a to Tr24a are controlled in accordance with the corresponding ones of the control signals outputted from the timing generator 7.

The voltage of the analog signal Vin is inputted to a source of the MOS transistor Tr21a (corresponding to an example of the first switch), and one terminal of the capacitor C20a is connected to a drain of the MOS transistor Tr21a. The corresponding one of the lower bit reference voltages outputted from the multiplexer 8 is inputted to a source of the MOS transistor Tr22a (corresponding to an example of the second switch), and the one terminal of the capacitor C20a is connected to a drain of the MOS transistor Tr22a. The other terminal of the capacitor C20a is connected to a drain of the MOS transistor Tr23a (corresponding to an example of the third switch), and a portion having a reference potential (a grounding potential in this case) developed thereat is connected to a source of the MOS transistor Tr23a. Also, the other terminal of the capacitor C20a is connected to a source of the MOS transistor Tr24a, and a drain of the MOS transistor Tr24a is connected to the amplification stage 21.

Also, in the phase of the reset mode, a gate signal having an H level is inputted from the timing generator 7 to each of gates of the MOS transistor Tr21a and the MOS transistor Tr23a. As a result, each of the MOS transistor Tr21a and the MOS transistor Tr23a is turned ON (in the close state). This results in that the voltage of the analog signal Vin is applied to the capacitor C20a, so that the voltage developed across the opposite terminals of the capacitor C20a becomes the voltage of the analog signal Vin, thereby sampling the voltage of the analog signal Vin in the capacitor C20a.

After that, in the phase of the comparison mode, a gate signal having the H level is inputted from the timing generator 7 to each of the MOS transistors Tr22a and Tr24a, thereby turning ON each of the MOS transistors Tr22a and Tr24a (in the close state). As a result, the corresponding one of the lower bit reference voltages outputted from the multiplexer 8 is applied to the capacitor C20a. This leads to that a difference voltage between the voltage of the analog signal Vin and the corresponding one of the lower bit reference voltages is outputted from the comparison stage 20a to the amplification stage 21.

The comparison stage 20b of the lower bit comparing portion 4, as shown in FIG. 3, includes MOS transistors Tr21b to Tr24b, and a capacitor C20b similarly to the case of the comparison stage 20a, and thus performs the same operation as that of the comparison stage 20a. Also, the comparison stage 20b and the comparison stage 20a operate alternately.

Here, in the serial-parallel type analog-to-digital converter 1 of this embodiment, before the operation mode of each of the comparison stages 20a and 20b proceeds to the comparison mode after it proceeded to the reset mode, as shown in FIG. 4, the multiplexer 8 is operated in accordance with the comparison result obtained in the higher bit comparing portion 3 to select the lower bit reference voltages which are in turn outputted to the lower bit comparing portion 4. That is to say, before each of the MOS transistors Tr22a (Tr22b) and Tr24a (Tr24b) is turned ON (in the close state) in the comparison mode after each of the MOS transistors Tr21a (Tr21b) and Tr23a (Tr23b) was turned ON (in the close state) in the phase of the reset mode in the comparison stage 20a (20b), the multiplexer 8 is operated in accordance with the comparison result obtained in the higher bit comparing portion 3 to select the lower bit reference voltages which are in turn outputted to the comparison stage 20a in the lower bit comparing portion 4.

As a result, the precharge is previously performed between the output portion of the multiplexer 8 as the reference voltage selecting portion, and each of the sources of the MOS transistors Tr22a and Tr22b.

As a result, the precharge is previously performed between each of the comparison stages 20a and 20b, and the multiplexer 8 before the operation mode of each of the comparison stages 20a and 20b proceeds to the comparison mode. Thus, it is possible to reduce the influence executed from the parasitic capacitance parasitic between each of the comparison stages 20a and 20b, and the multiplexer 8 on the speed-up.

It is noted that in the multiplexer 8, the lower bit reference voltages generated by the reference voltage generator 2 are inputted to the MOS transistors as the switches, respectively. For example, MOS transistors TR15a1, Tr15a2, . . . are connected between portions, of the reference voltage generator 2, having the lower bit reference voltages developed thereat, and the comparison stage 20a. Also, the MOS transistors Tr15b1, Tr15b2, . . . are connected between the portions, of the reference voltage generator 2, having the lower bit reference voltages developed thereat, and the comparison stage 20b. Hereinafter, when any one of the MOS transistors Tr15a1, Tr15a2, . . . is indicated, it is assumed to be collectively represented by the MOS transistor Tr15a. Similarly, when any one of the MOS transistors Tr15b1, Tr15b2, . . . is indicated, it is assumed to be collectively represented by the MOS transistor Tr15b.

Here, an operation of the serial-parallel type analog-to-digital converter 1 of this embodiment will be concretely described with reference to FIGS. 5A to 5H. FIGS. 5A to 5H are each a timing chart explaining an operation timing of the serial-parallel type analog-to-digital converter 1 of this embodiment.

Figure 5:
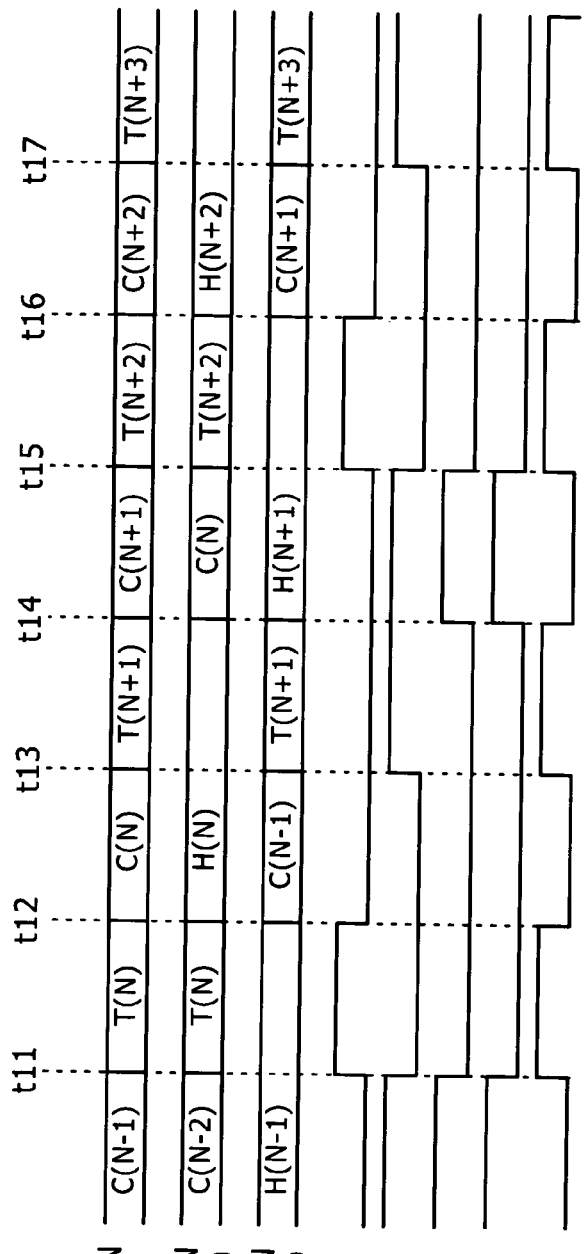
FIGS. 5A to 5H are each a timing chart explaining an operation timing of the serial-parallel type analog-to-digital converter shown in FIG. 1.

Firstly, for a time period from a time t11 to a time t12, in order to generate an N-th digital signal, the comparison stage 10 of the higher bit comparing portion 3 samples the voltage of the analog signal Vin (T(N) in FIG. 5A). Likewise, in order to generate the N-th digital signal, the comparison stage 20a of the lower bit comparing portion 4 also samples the voltage of the analog signal Vin (T(N) in FIG. 5B). On the other hand, the comparison stage 20b of the lower bit comparing portion 4 is in a state of holding the voltage of the analog signal Vin for generation of an (N−1)-th digital signal (H(N−1) in FIG. 5C).

Here, the sampling for the voltage of the analog signal Vin by the comparison stage 20a of the lower bit comparing portion 4 is performed by turning ON each of the MOS transistors Tr21a and Tr23a (in the close state) (refer to FIG. 5D). At this time, no corresponding one of the lower bit reference voltages is applied to the comparison stage 20a because the switches (the MOS transistors Tr15a) of the multiplexer 8, and the MOS transistor Tr22a are each held in the OFF state (in the open state) (refer to FIGS. 5E and 5F). In addition, the reference potential (the grounding potential in this case) is inputted to the amplification stage 21 because the MOS transistor Tr24a is held in the OFF state (in the open state) and the MOS transistor Tr25 is held in the ON state (in the close state) (refer to FIGS. 5G and 5H).

For a next time period from the time t12 to a time t13, in order to generate the N-th digital signal, the comparison stage 10 of the higher bit comparing portion 3 outputs a difference voltage between the voltage of the analog signal Vin, and the corresponding one of the higher bit reference voltages (C(N) in FIG. 5A). At this time, the comparison stage 20a of the lower bit comparing portion 4 is in a state of holding the voltage of the analog signal Vin for generation of the N-th digital signal (H(N) in FIG. 5B). On the other hand, the comparison stage 20b of the lower bit comparing portion 4 generates the difference voltage between the voltage of the analog signal Vin for the generation of the (N−1)-th digital signal and the corresponding one of the lower bit reference voltages, and outputs the resulting difference voltage between them (C(N−1) in FIG. 5C).

Here, the holding of the voltage of the analog signal Vin by the comparison stage 20a of the lower bit comparing portion 4 is performed by turning OFF each of the MOS transistors Tr21a to Tr24a (in the open state) (refer to FIGS. 5D, 5F and 5G).

For a next time period from the time t13 to a time t14, in order to generate an (N+1)-th digital signal, the comparison stage 10 of the higher bit comparing portion 3 samples the voltage of the analog signal Vin (T(N+1) in FIG. 5A). Likewise, in order to generate the (N+1)-th digital signal, the comparison stage 20b of the lower bit comparing portion 4 also samples the voltage of the analog signal Vin (T(N+1) in FIG. 5C). On the other hand, the comparison stage 20a of the lower bit comparing portion 4 is in a state of holding the voltage of the analog signal Vin for generation of the N-th digital signal (H(N) in FIG. 5B).

At this time, the multiplexer 8 selects the corresponding one of the lower bit reference voltages (by turning ON the corresponding one of the MOS transistors Tr15a as the switches) in accordance with the difference voltage outputted from the comparison stage 10 of the higher bit comparing portion 3 in order to generate the N-th digital signal, and outputs the corresponding one of the lower bit reference voltages thus selected to the comparison stage 20a of the lower bit comparing portion 4.

As described above, while the one comparison stage 20b of the lower bit comparing portion 4 samples the voltage of the analog signal Vin (that is, while the operation mode is the reset mode), the precharge can be previously performed between the MOS transistor Tr22a of the comparison stage 20a, and the multiplexer 8 by inputting the corresponding one of the lower bit reference voltages to the other comparison stage 20a.

As a result, the precharge is previously performed between the comparison stage 20a and the multiplexer 8 before the operation mode of the comparison stage 20a proceeds to the comparison mode. Therefore, it is possible to reduce the influence exerted from the parasitic capacitance parasitic between the comparison stage 20a and the reference voltage selecting portion on the speed-up.

For a next time period from the time t14 to a time t15, in order to generate the (N+1)-th digital signal, the comparison stage 10 of the higher bit comparing portion 3 outputs a difference voltage between the voltage of the analog signal Vin and the corresponding one of the higher bit reference voltages (C(N+1) in FIG. 5A). At this time, the comparison stage 20a of the lower bit comparing portion 4 outputs a difference voltage between the voltage of the analog signal Vin for generation of the N-th digital signal, and the corresponding one of the lower bit reference voltages (C(N) in FIG. 5B). On the other hand, the comparison stage 20b of the lower bit comparing portion 4 is in a state of holding the voltage of the analog signal Vin for generation of an (N+1)-th digital signal (H(N+1) in FIG. 5C).

Here, the comparison of the voltage of the analog signal Vin with the corresponding one of the lower bit reference voltages is performed by turning ON the MOS transistor Tr22a (in the close state) (refer to FIG. 5F).

In addition, at this time, the MOS transistor Tr24a is turned ON (in the close state) (refer to FIG. 5G), thereby outputting the difference voltage between the voltage of the analog signal Vin, and the corresponding one of the lower bit reference voltages from the comparison stage 20a of the lower bit comparing portion 4 to the amplification stage 21.

Also, the output signal from the amplification stage 21 is binarized by the comparison/hold section 22, and the lower bit side digital signal is then outputted from the encoder 6.

From now on, similarly, the same operation as that for the time period from the time t11 to the time t15 is repeatedly performed. In addition, although in the foregoing, the description has centered around the operation of the comparison stage 20a of the lower bit comparing portion 4, the comparison stage 20b of the lower bit comparing portion 4 performs the interleave operation which is shifted by one cycle with respect to the operation of the comparison stage 20a, and thus a description thereof is omitted here for the sake of simplicity.

Now, when each of the operation states of the MOS transistors Tr22a and Tr22b proceeds to the ON state (the close state) in the phase of the comparison mode in each of the comparison stages 20a and 20b, the noises are generated due to the switching operation of the MOS transistors Tr22a and Tr22b in some cases. Thus, the noises may exert an influence on the speed-up of the operation of the serial-parallel type analog-to-digital converter.

Figure 6:
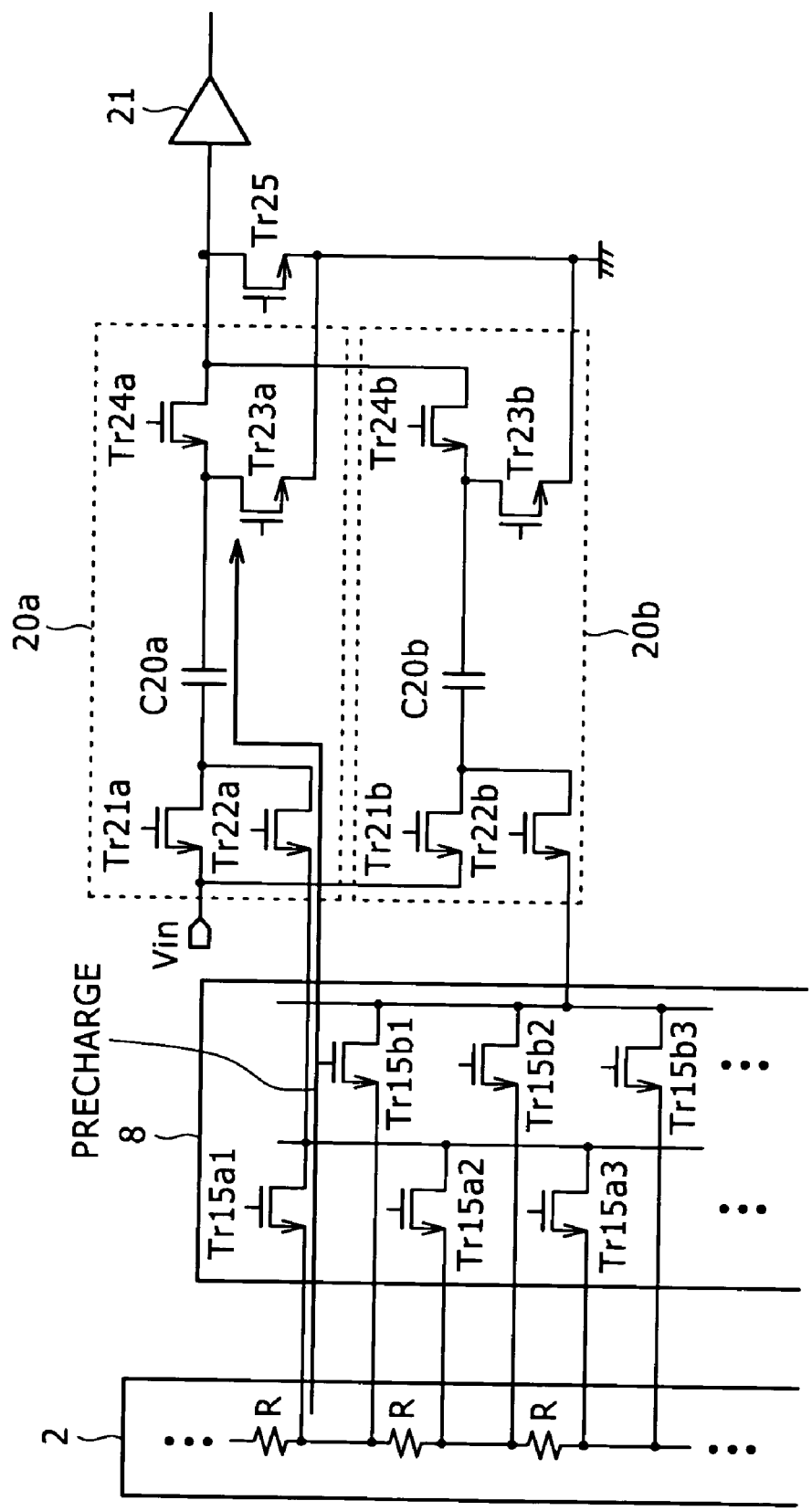
FIG. 6 is a circuit diagram explaining operations of other comparison stages of the lower bit comparing portion shown in FIG. 1.
Figure 7:
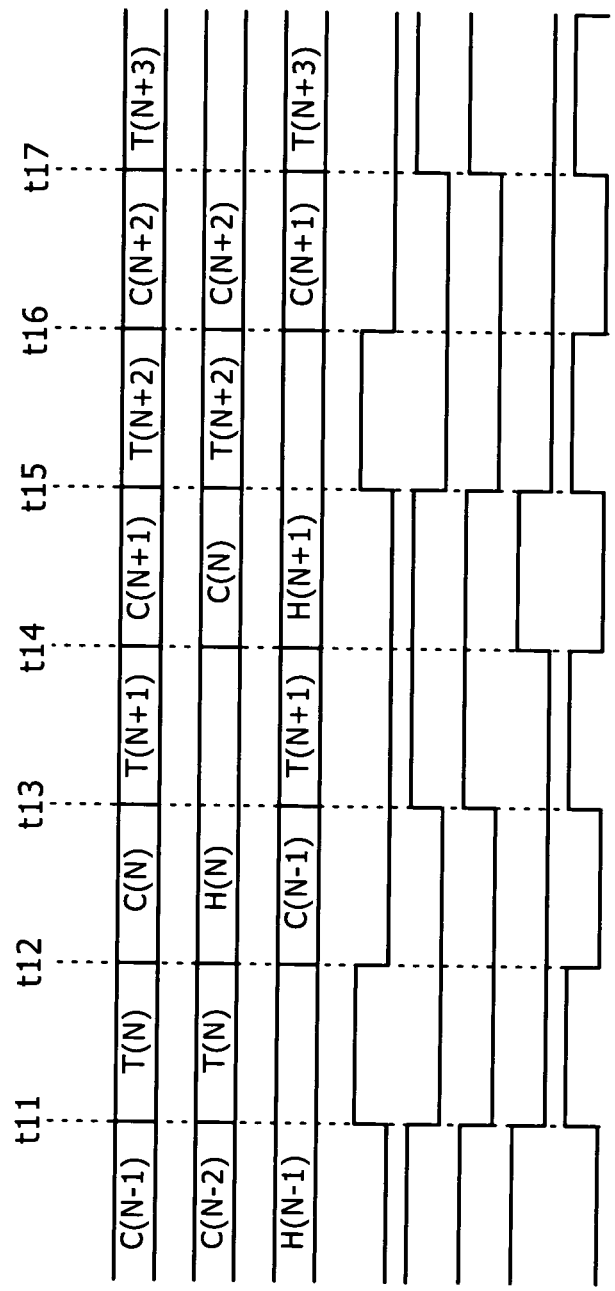
FIGS. 7A to 7H are each a timing chart explaining another operation timing of the serial-parallel type analog-to-digital converter shown in FIG. 1.
Figure 8:
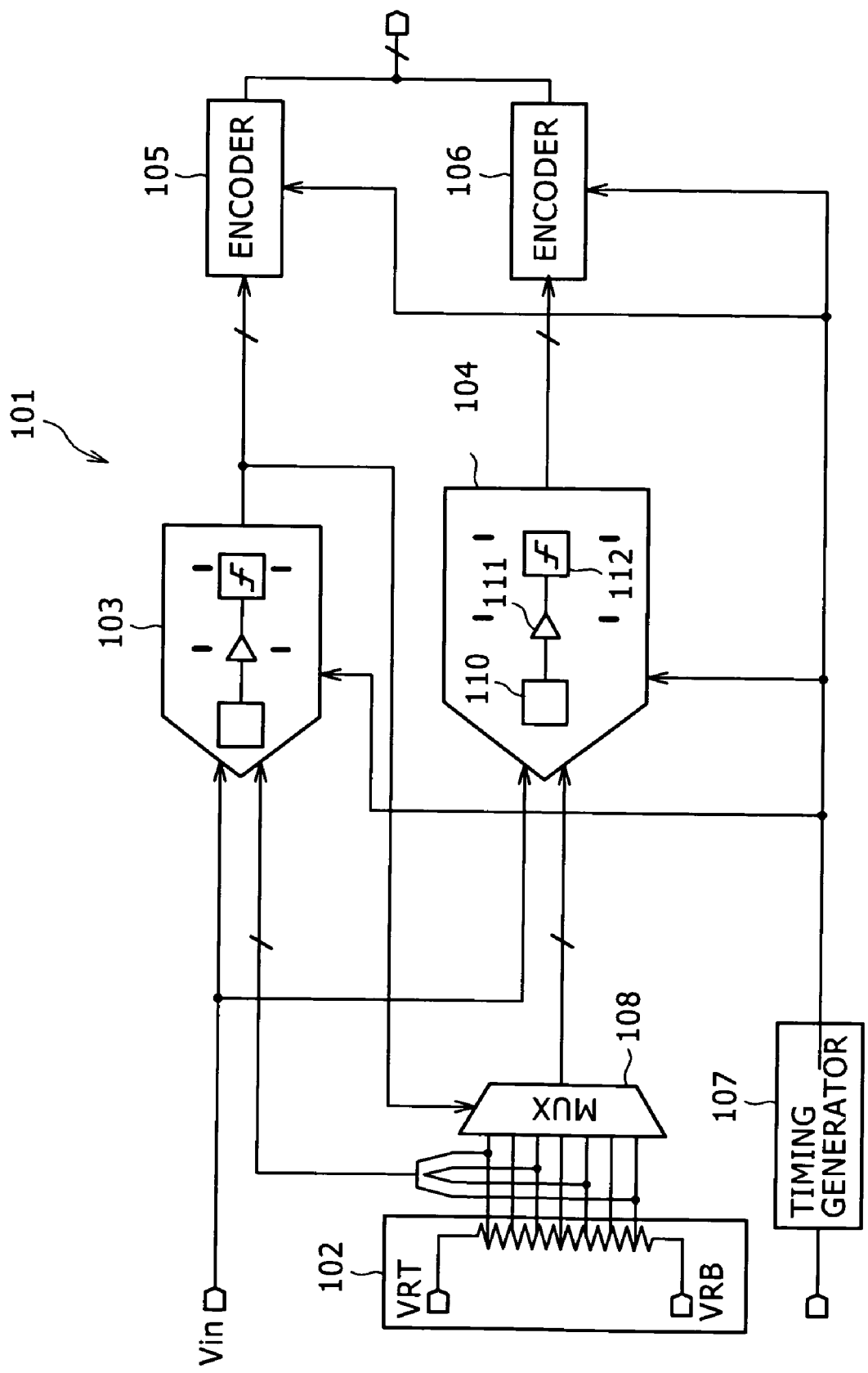
FIG. 8 is a block diagram, partly in circuit, showing a schematic configuration of a serial-parallel type analog-to-digital converter in the related art.
Figure 9A:
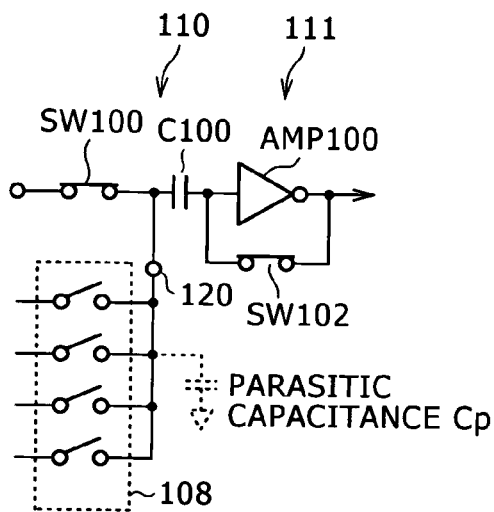
FIGS. 9A and 9B are respectively circuit diagrams each showing a concrete configuration of a comparison stage shown in FIG. 8.
Figure 9B:
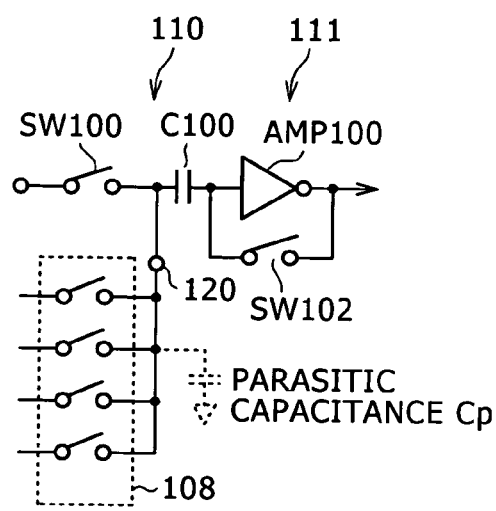
Figure 10A:
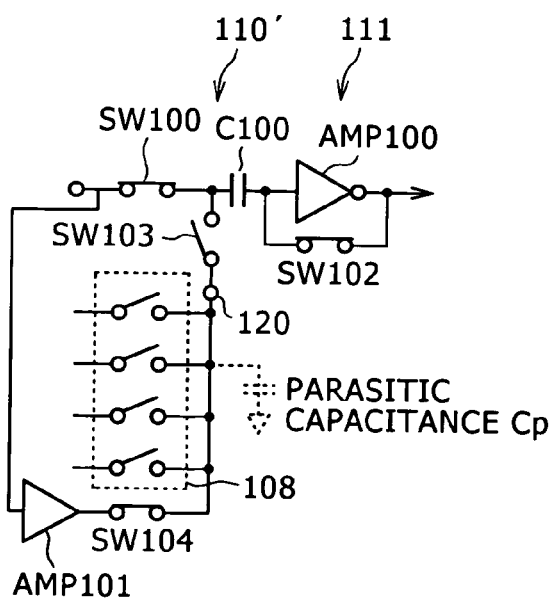
FIGS. 10A and 10B are respectively circuit diagrams each showing a concrete configuration of another comparison stage shown in FIG. 8.
Figure 10B:
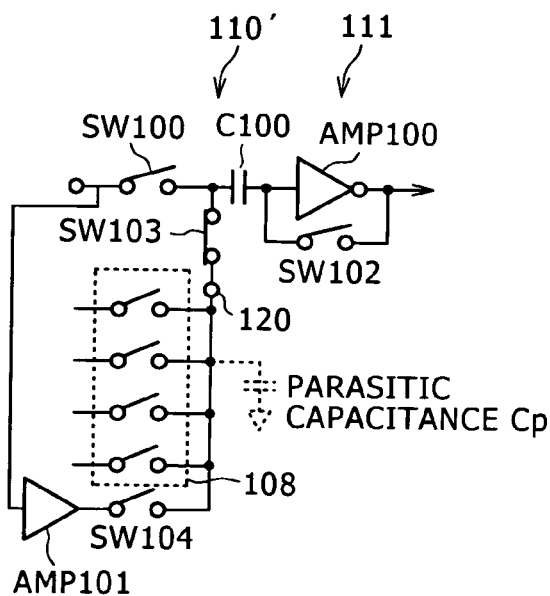

In order to cope with such a situation, each of the MOS transistors Tr22a and Tr22b is also turned ON (in the close state) before the operation mode proceeds to the comparison mode in each of the comparison stages 20a and 20b. As a result, the noises generated due to the operation of the MOS transistors Tr22a and Tr22b are preferably prevented from exerting the influence on the comparison operation in the phase of the comparison mode in each of the comparison stages 20a and 22b (refer to FIG. 6, and FIGS. 7A to 7H). FIG. 6 is a circuit diagram explaining another operation of each of the comparison stages 20a and 20b of the lower bit comparing portion 4. FIGS. 7A to 7H are each a timing chart explaining another operation timing in the serial-parallel type analog-to-digital converter 1.

The timing explanatory diagrams of FIGS. 7A to 7H are different from those of FIGS. 5A to 5H in that for a time period from the time t13 to the time t14, the MOS transistor Tr22a is held in the ON state.

That is to say, for the time period from the time t13 to the time t14, the control signal having the H level is inputted from the timing generator 7 to the gate of the MOS transistor Tr22a, thereby turning ON the MOS transistor Tr22a. As a result, before the operation mode of the comparison stage 20a proceeds to the comparison mode, the corresponding one of the lower bit reference voltages is applied to a portion extending from the output portion of the multiplexer 8 to the one terminal side of the capacitor C20a (the terminal side of the capacitor C20a connected to the MOS transistor Tr24a) (refer to FIG. 6). It is noted that this operation also applies to the comparison stage 20b of the lower bit comparing portion 4.

As has been described, while one of the comparison stages 20a and 20b is set in the reset mode, the MOS transistor Tr22a or Tr22b, as the second switch, of the other comparison stage is held in the ON state (in the close state), and the MOS transistor Tr24a or Tr24b, as the fourth switch is held in the OFF state (in the open state). As a result, the precharge is previously performed up to the other terminal of the capacitor C20a or C20b without exerting an influence on the amplification stage 21, thereby speeding up the operation of the serial-parallel type analog-to-digital converter by suppressing the influence by the noises generated due to the operation of the MOS transistor Tr22a or Tr22b.

Although the embodiment of the present invention has been described in detail so far with reference to the accompanying drawings, it is merely an exemplification, and thus the present invention can be implemented in the form of any other suitable embodiment for which various changes and improvements may be made based on the knowledge of those skilled in the art.

What is claimed is:

1. A serial-parallel type analog-to-digital converter comprising:
   a reference voltage generator configured to generate a plurality of different reference voltages;
   a higher bit comparing portion and a lower bit comparing portion each having a comparison stage for alternately performing a reset mode of sampling a voltage of an analog signal, and a comparison mode of comparing the voltage of the analog signal with the corresponding one of the plurality of different reference voltages; and
   a reference voltage selecting portion configured to select the reference voltages corresponding to a comparison result obtained from said higher bit comparing portion from the plurality of different reference voltages generated in said reference voltage generator, and outputting the reference voltages thus selected to said lower bit comparing portion;
   said serial-parallel type analog-to-digital converter serving to convert the analog signal into a digital signal in accordance with the comparison results obtained from said higher bit comparing portion and said lower bit comparing portion;

wherein said lower bit comparing portion includes
the plurality of comparison stages each performing an interleave operation, which operates one of the plurality of comparison stages in the reset mode in a phase of the reset mode of said higher bit comparing portion, and operates one of the plurality of comparison stages in the comparison mode in a phase of the comparison mode of said higher bit comparing portion,
when one comparison stage of the plurality of comparison stages of said lower bit comparing portion is in the reset mode, the corresponding ones of the reference voltages being inputted from said reference voltage selecting portion to other comparison stages of the plurality of comparison stages.

2. The serial-parallel type analog-to-digital converter according to claim 1, further comprising
an amplification stage configured to amplify output signals from said comparison stages of said lower bit comparing portion,
wherein each of said comparison stages of said lower bit comparing portion includes
a first switch configured to input the voltage of the analog signal,
a second switch configured to input the corresponding one of the reference voltages outputted from said reference voltage selecting portion,
a capacitor connected in one terminal to each of output portions of said first switch and said second switch,
a third switch connected in one terminal to the other terminal of said capacitor, and
a fourth switch connected between the other terminal of said capacitor and said amplification portion;
in the phase of the reset mode, each of said first switch and said third switch being held in an ON state to input the voltage of the analog signal to said capacitor, thereby sampling the voltage of the analog signal in said capacitor;
in the subsequent phase of the comparison mode, each of said second switch and said fourth switch being held in the ON state to output a difference voltage between the voltage of the analog signal and the corresponding one of the reference voltages from said capacitor;
when one of said plurality of comparison stages of said lower bit comparing portion is in the reset mode, said second switch of the other of said plurality of comparison stages of said lower bit comparing portion being held in the ON state.

3. A serial-parallel type analog-to-digital converting method for use in a serial-parallel type analog-to-digital converter comprising:
a reference voltage generator configured to generate a plurality of different reference voltages;
a higher bit comparing portion and a lower bit comparing portion each having a comparison stage for alternately performing a reset mode of sampling a voltage of an analog signal, and a comparison mode of comparing the voltage of the analog signal with the corresponding one of the plurality of different reference voltages; and
a reference voltage selecting portion configured to select the reference voltages corresponding to a comparison result obtained from said higher bit comparing portion from the plurality of different reference voltages generated in said reference voltage generator, and outputting the reference voltages thus selected to said lower bit comparing portion;
said serial-parallel type analog-to-digital converter serving to convert the analog signal into a digital signal in accordance with the comparison results obtained from said higher bit comparing portion and said lower bit comparing portion;
said lower bit comparing portion including
a plurality of comparison stages each performing an interleave operation, said serial-parallel type analog-to-digital converting method including
a first step of operating one comparison stage of said plurality of comparison stages provided in said lower bit comparing portion in the reset mode in a phase of the reset mode of said higher bit comparing portion, and
a second step of operating one comparison stage of the plurality of comparison stages provided in said lower bit comparing portion in the comparison mode in a phase of the comparison mode of said higher bit comparing portion,
inputting the corresponding ones of the reference voltages from said reference voltage selecting portion to other comparison stages of said plurality of comparison stages provided in said lower bit comparing portion when the one comparison stage is in the reset mode in the first step.

\* \* \* \* \*